(12) United States Patent
Jiang et al.

(10) Patent No.: US 9,413,312 B2
(45) Date of Patent: Aug. 9, 2016

(54) REAL-TIME SHORT-CIRCUIT DETECTION

(75) Inventors: Xicheng Jiang, Irvine, CA (US); Jianlong Chen, Irvine, CA (US); Sasi Kumar Arunachalam, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 1295 days.

(21) Appl. No.: 13/304,241

(22) Filed: Nov. 23, 2011

(65) Prior Publication Data

US 2013/0049763 A1 Feb. 28, 2013

Related U.S. Application Data

(60) Provisional application No. 61/527,792, filed on Aug. 26, 2011, provisional application No. 61/528,622, filed on Aug. 29, 2011.

(51) Int. Cl.
| | |
|---|---|
| *G01R 31/14* | (2006.01) |
| *H03F 3/38* | (2006.01) |
| *H03F 3/04* | (2006.01) |
| *H03F 3/217* | (2006.01) |
| *H02M 1/32* | (2007.01) |
| *H03F 1/52* | (2006.01) |
| *H03F 3/187* | (2006.01) |
| *G01R 31/02* | (2006.01) |

(52) U.S. Cl.
CPC .............. *H03F 3/2173* (2013.01); *H02M 1/32* (2013.01); *H03F 1/523* (2013.01); *H03F 3/187* (2013.01); *G01R 31/024* (2013.01)

(58) Field of Classification Search
USPC ........................................ 330/10, 207 A, 251
See application file for complete search history.

(56) References Cited

U.S. PATENT DOCUMENTS

| | | | | |
|---|---|---|---|---|
| 7,733,171 | B2 * | 6/2010 | Guilherme | ............ H03F 3/2173 330/10 |
| 7,755,432 | B1 * | 7/2010 | Krishnamoorthy | ........... 330/298 |
| 2007/0139839 | A1 * | 6/2007 | Yoshihara | .................... 361/93.1 |

OTHER PUBLICATIONS

M. Teplechuk et al., "Filterless integrated Class-D audio amplifier achieving 0.0012% THD+N and 96dB PSRR when supplying 1.2W," ISSCC Dig. Tech. Papers, pp. 240-241, Feb. 2011.
S. Samala et al., "45nm CMOS Class-D audio driver with 79% efficiency and 100dB SNR," ISSCC Dig. Tech. Papers, pp. 86-88, Feb. 2010.
P. Siniscalchi et al., "A 20W/channel Class-D amplifier with significantly reduced common-mode radiated emissions," ISSCC Dig. Tech. Papers, pp. 448-449, Feb. 2009.

(Continued)

*Primary Examiner* — Hieu Nguyen
(74) *Attorney, Agent, or Firm* — Oblon, McClelland, Maier & Neustadt, L.L.P.

(57) ABSTRACT

Presented are circuits and methods for providing real-time short-circuit detection, capable of detecting a short-circuit prior to occurrence of an over-limit current event. Such a circuit can be used to provide real-time short-circuit detection for a switched-mode system for a switched-mode system having a pre-driver and a power stage, and includes a reference block for generating a reference voltage according to drive signals provided by the pre-driver, and a comparator, which may be a synchronized comparator. The comparator is configured to compare the reference voltage to a switching node voltage generated in a power stage of the switched-mode system, and to produce an output enabling detection of the short-circuit in the switched-mode system.

16 Claims, 4 Drawing Sheets

(56) References Cited

OTHER PUBLICATIONS

S. Damphousse et al., "All digital spread spectrum clock generator for EMI reduction," IEEE Journal of Solid-State Circuits, vol. 42, pp. 145-150, Jan. 2007.

R. Gariboldi et al., "A 70mOhm intelligent high side switch with full diagnostics," IEEE Journal of Solid-State Circuits, vol. 31, pp. 915-923, Jul. 1996.

M. Berkhout, "Integrated overcurrent protection system for Class-D audio power amplifier," IEEE Journal of Solid-State Circuits, vol. 40, pp. 2237-2245, Nov. 2005.

* cited by examiner

REAL-TIME SHORT-CIRCUIT DETECTION

RELATED APPLICATIONS

The present application claims the benefit of and priority to the provisional application entitled "Circuit Techniques to Overcome Class-D Audio Amplifier Limitations in Mobile Communication Devices," Ser. No. 61/527,792, filed on Aug. 26, 2011. In addition, the present application claims the benefit of and priority to provisional application Ser. No. 61/528, 622 filed on Aug. 29, 2011 and entitled "Real-Time Short-Circuit Detection Scheme for Integrated Class-D Audio Amplifier." The disclosures in both of those pending provisional applications are hereby incorporated fully by reference into the present application.

BACKGROUND

Switched-mode systems, such as switching regulators and class-D audio amplifiers, for example, are becoming increasingly desirable for use in battery powered portable and mobile devices due to their significantly higher operating efficiencies when compared to linear-mode systems. However, reliability concerns related to the vulnerability of switched-mode systems to damage resulting from short-circuit load conditions have thus far prevented their complete adoption in mobile devices. In an attempt to mitigate this potential issue in switched-mode systems, conventional implementations utilize various short-circuit detection strategies intended to avoid, or at least limit, damage when a short-circuit load condition occurs. Strategies for detecting short-circuit load conditions are complicated, however, by the variability in load impedances that are sometimes encountered in switching implementations. For example, a nominally eight ohm (8Ω) loudspeaker serving as the load for a class-D amplifier implemented as an audio amplifier in a mobile device can have a "normal" impedance as low as 4Ω. In addition, attempts to provide accurate short-circuit detection in the switching audio amplifier setting may be further complicated by the continuous switching of the class-D audio amplifier power transistors.

SUMMARY

The present disclosure is directed to real-time short-circuit detection, substantially as shown in and/or described in connection with at least one of the figures, as set forth more completely in the claims.

DETAILED DESCRIPTION

Figure 1:
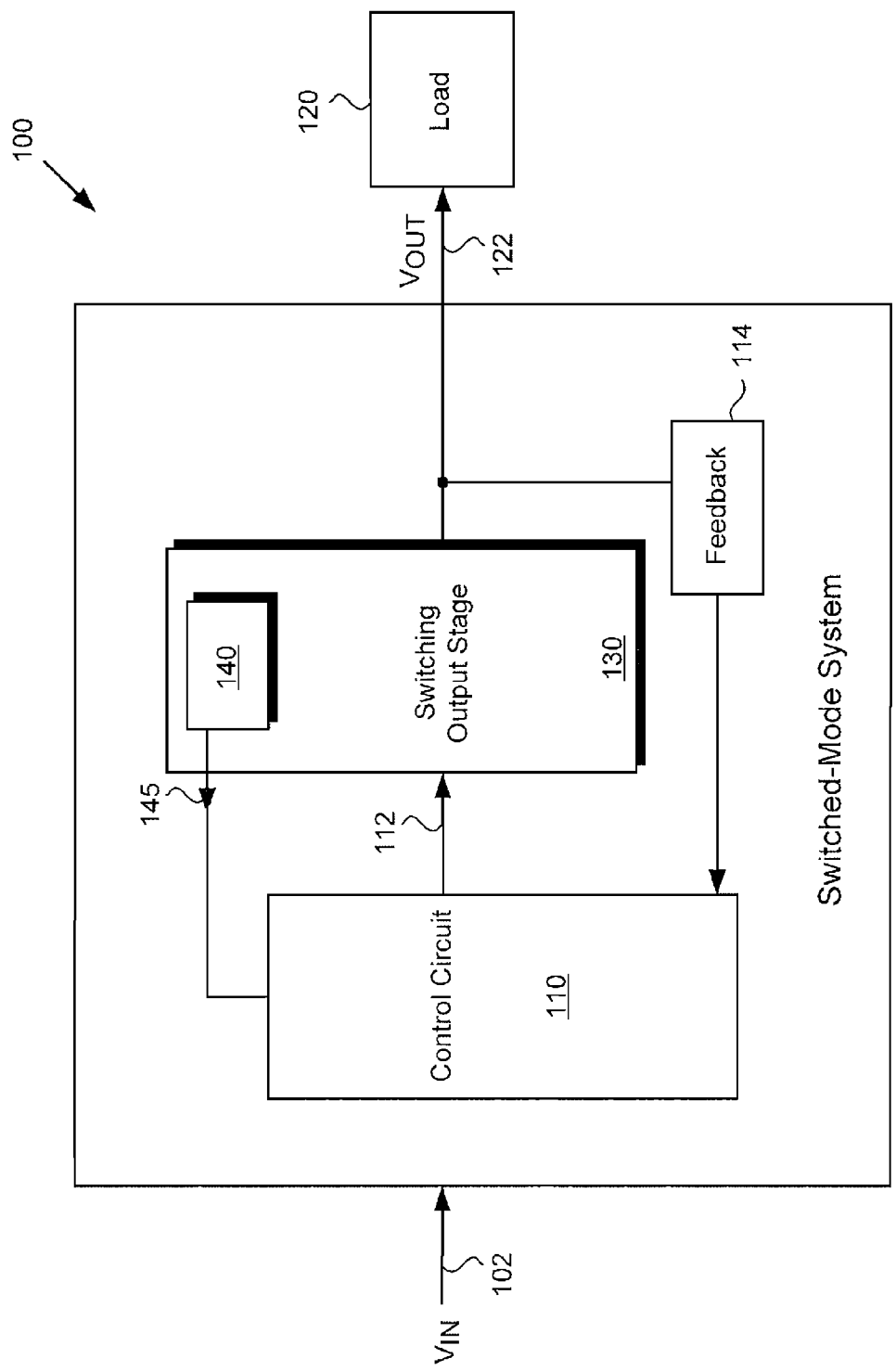
FIG. 1 shows a block diagram of a switched-mode system including an exemplary circuit for providing real-time short-circuit detection.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a block diagram of a switched-mode system including an exemplary circuit for providing real-time short-circuit detection, capable of overcoming the drawbacks and deficiencies encountered in the conventional art. As shown in FIG. 1, switched-mode system 100, which may be a class-D audio amplifier or a switching regulator such as a buck converter, for example, includes control circuit 110, switching output stage 130 including circuit 140 for providing real-time short-circuit detection, and feedback circuit 114. As further shown in FIG. 1, switched-mode system 100 is implemented so as to receive an input voltage $V_{IN}$ at input 102 and to provide an output voltage $V_{OUT}$ to load 120 at output 122.

Control circuit 110 may include a pulse-width modulator (PWM), for example, implemented to provide control signal 112 to switching output stage 130. Switching output stage 130 may include a power stage having a plurality of power switches (power switches not shown in FIG. 1), such as two or four power switches, for example, controlled according to control signal 112 so as to produce output voltage $V_{OUT}$ at output 122. In one implementation, switched-mode system 100 may be fabricated as an integrated circuit (IC) to provide voltage conversion and/or regulation for load 120, which may or may not also be implement as part of the same monolithic IC.

It is noted that, in the interest of conceptual clarity, only selected features of switched-mode system 100 are shown in FIG. 1. Other features typically found in a switched-mode system, such as an output inductor when switched-mode system 100 is implemented as switching regulator, for example, are not expressly shown in FIG. 1, but are well known in the art. It is further noted that although input 102, control signal 112, and output 122 are represented by single directed lines for simplicity, that depiction is not to be interpreted as limiting. For example, in implementations in which switched-mode system 100 is a class-D audio amplifier, output 122 may be provided as a differential output to drive load 120, which in that implementation can correspond to a speaker, such as a nominally eight ohm (8Ω) speaker.

In substantially all conventional short-circuit detection designs used today, a short-circuit load condition of a switched-mode system is typically detected only when an over-limit current event actually occurs. However, even relatively transitory over-limit current events can have undesirably damaging consequences, and may result in excessive electromigration in IC metallization and bonding wires, for example, as well as rapid depletion of a battery power source when the switched-mode system experiencing the short-circuit load condition is implemented in a battery powered mobile device.

Switched-mode system 100, shown in FIG. 1, overcomes the drawbacks and deficiencies of conventional designs by circuit 140 for providing real-time short-circuit detection. As will be explained more fully by reference to FIGS. 2, 3, and 4, circuit 140 is configured to produce output 145 enabling detection of a short-circuit load condition at load 120 of switched-mode system 100. Moreover, and as will be explained in greater detail below, circuit 140 is configured to enable detection of a short-circuit load condition at load 120 prior to occurrence of an over-limit current event in switching output stage 130, thereby substantially preventing the occurrence of such over-limit current events for switched-mode system 100.

Figure 2:
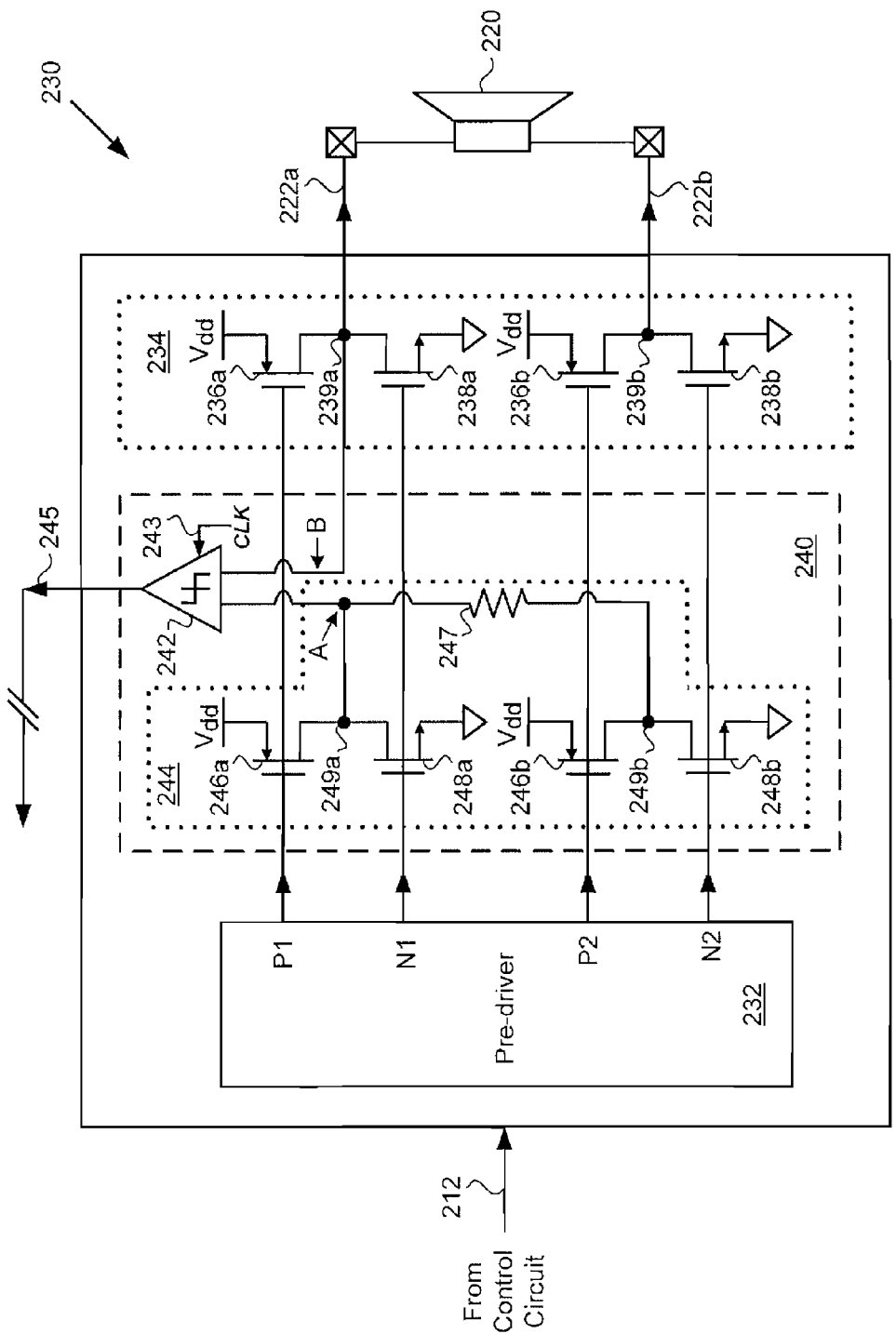
FIG. 2 shows a more detailed diagram of a switching output stage of a switched-mode system including an exemplary circuit for providing real-time short-circuit detection.

Referring to FIG. 2, FIG. 2 shows a more detailed diagram of a switching output stage of a switched-mode system including an exemplary circuit for providing real-time short-circuit detection. FIG. 2 shows switching output stage 230 including circuit 240 for providing real-time short-circuit detection, and further shows circuit 240 producing output 245. As also shown in FIG. 2, switching output stage 230 receives control signal 212 as an input from a control circuit (control circuit not shown in FIG. 2) and provides differential outputs 222a and 222b to load 220. Furthermore, and as may be understood from FIG. 2, switching output stage 230 may be implemented as part of a class-D audio amplifier providing differential outputs 222a and 222b for driving audio speaker load 220. Control signal 212, switching output stage 230 including circuit 240 for providing real-time short-circuit detection, output 245 of circuit 240, differential outputs 222a and 222b of switching output stage 230, and load 220 correspond respectively to control signal 112, switching output stage 130 including circuit 140 for providing real-time short-circuit detection, output 145 of circuit 140, output 122 of switching output stage 130, and load 120, in FIG. 1.

As shown in FIG. 2, according to the present implementation, in addition to circuit 240 for providing real-time short-circuit detection, switching output stage 230 includes power stage 234 having high side power switches 236a and 236b, and low side power switches 238a and 238b, as well as pre-driver 232 providing drive signals P1, N1, P2, and N2 for power stage 234. Also shown in FIG. 2 are switching nodes 239a and 239b of power stage 234.

Circuit 240 includes reference block 244 comparator 242, which may be a synchronized comparator, for example, as represented in exemplary implementation of FIG. 2. As further shown in FIG. 2, according to the present implementation, reference block 244 is coupled between pre-driver 232 and power stage 234. Moreover, according to the specific example shown in FIG. 2, reference block 244 includes replicas of power stage 234 and load 220. In other words, high side switches 246a and 246b, low side switches 248a and 248b, and switching nodes 249a and 249b may represent a substantially scaled-down replica of power stage 234, while reference resistor 247 may represent a correspondingly scaled-up replica of the impedance presented by load 220 during normal operation of the switched-mode system including switching output stage 230. For example, reference block 244 may correspond to a two hundred times scaled-down (1:200) replica of power stage 234, while reference resistor 247 may have a resistance value 200 times greater than the nominal impedance of load 220.

High side switches 246a and 246b, and low side switches 248a and 248b are controlled by respective drive signals P1, P2, N1, and N2, which are also applied as drive signals to respective high side power switches 236a and 236b, and low side power switches 238a and 238b of power stage 234. Reference block 244 is configured to produce a reference voltage at node "A" according to drive signals P1, N1, P2, and N2 provided by pre-driver 232. The reference voltage produced by reference block 242 at node A is provided as an input to synchronized comparator 242 of circuit 240, which is configured to compare the reference voltage at node A to a voltage generated by power stage 234 at switching node 239a, and to produce output 245 indicating detection of a short-circuit load condition at load 220. Synchronized comparator 242 is clocked using adaptive clock 243, which may be seen to represent a derived "clock" generated according to control signal 212 and drive signals P1, N1, P2, and N2.

Figure 3:
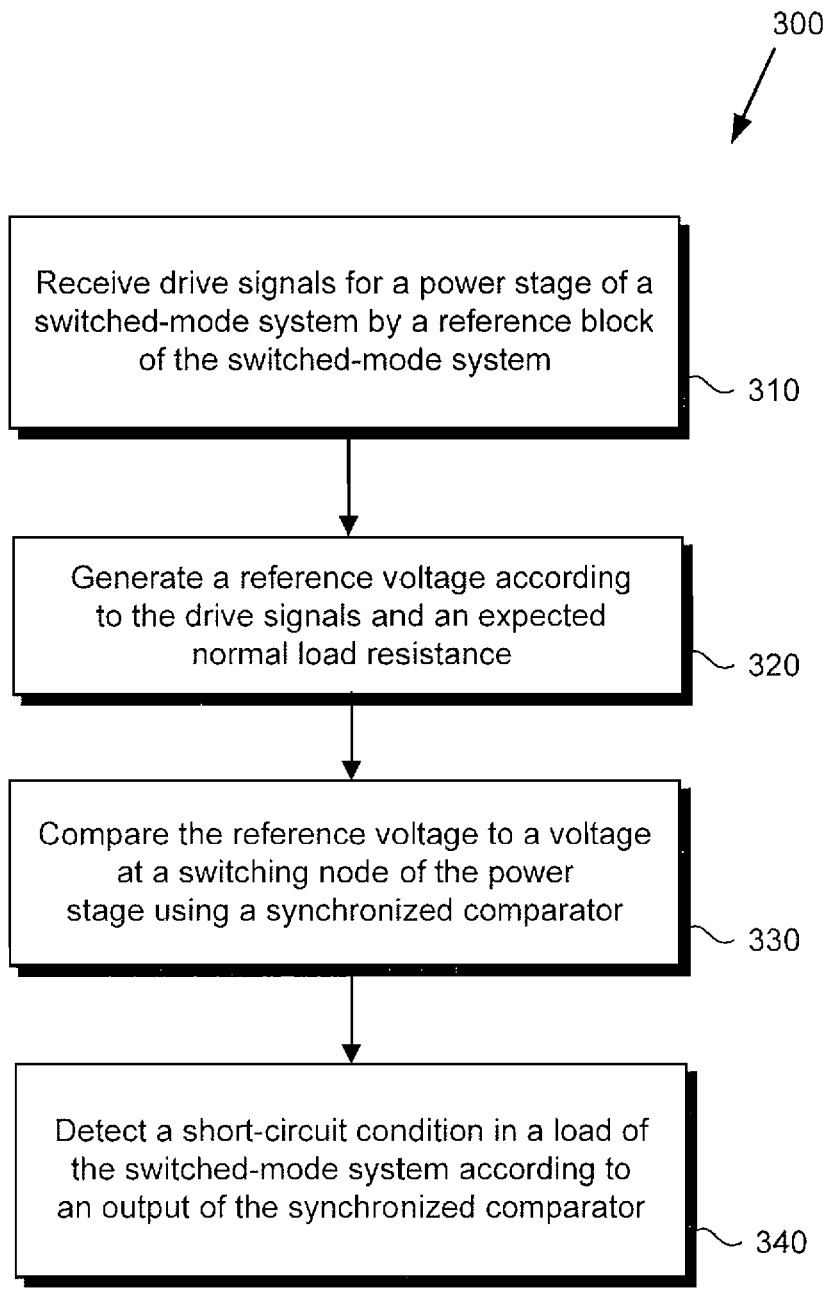
FIG. 3 is a flowchart presenting an exemplary method for providing real-time short-circuit detection.
Figure 4:
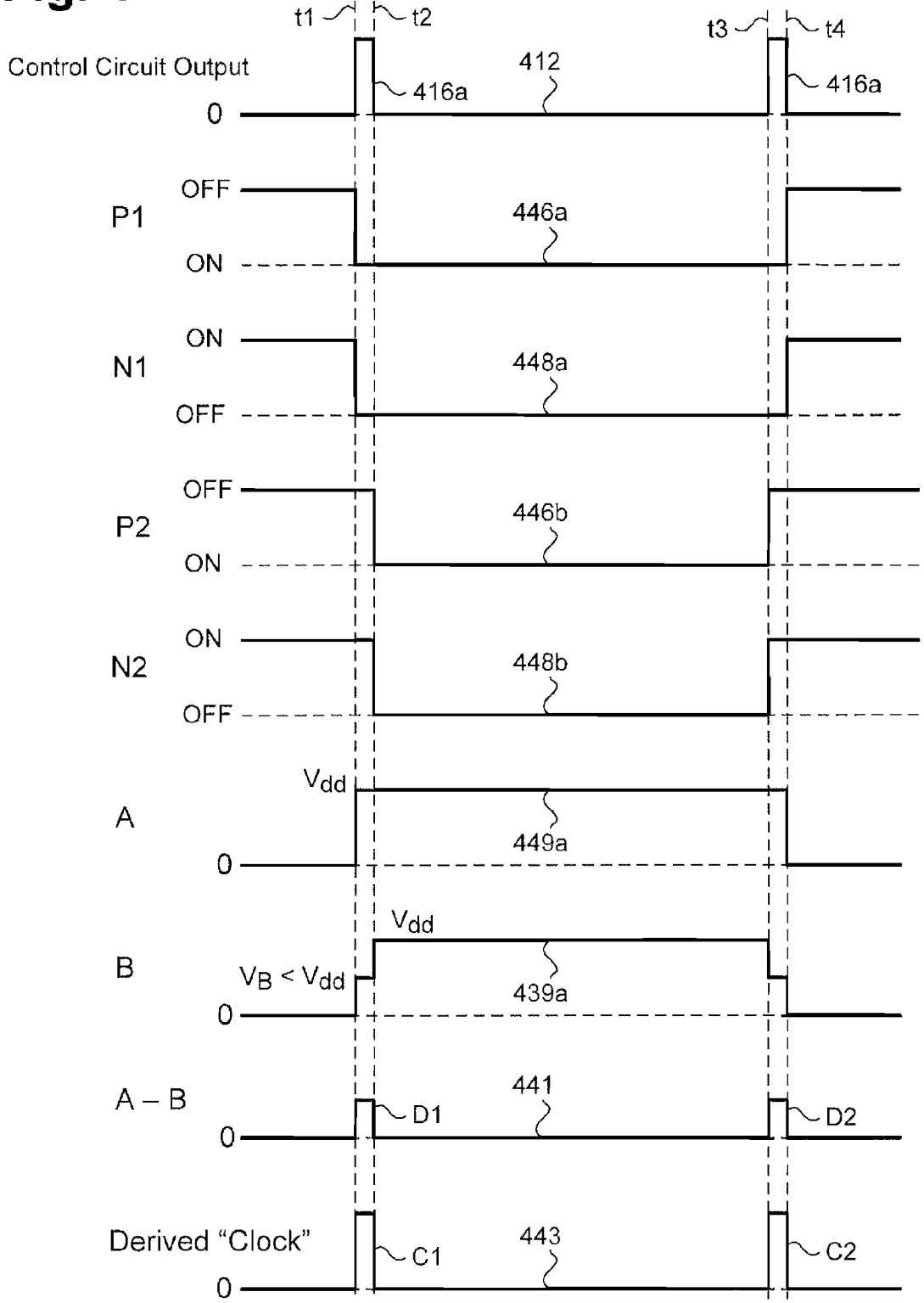
FIG. 4 is a timing diagram providing an overview of short-circuit detection performed using the exemplary circuit shown in FIG. 2.

FIGS. 1 and 2 will now be further described by reference to FIGS. 3 and 4. FIG. 3 shows flowchart 300, which describes an exemplary method of providing real-time short-circuit detection, while FIG. 4 is a timing diagram providing an exemplary overview of short-circuit detection performed using circuit 240, shown in FIG. 2. With respect to the method outlined in FIG. 3, it is noted that certain details and features have been left out of flowchart 300 that are apparent to a person of ordinary skill in the art.

Flowchart 300 begins when reference block 244 of circuit 240 receives drive signals P1, N1, P2, and N2 for power stage 234 (310). Referring now to FIG. 4, FIG. 4 shows traces 412, 446a, 448a, 446b, 448b, 449a, 439a, and 443, corresponding respectively to control signal 212, drive signals P1, N1, P2, and N2, the reference voltage at node A of reference block 244, the voltage at switching node 239a of power stage 234, and adaptive clock signal 243, in FIG. 2. Also shown in FIG. 4 is difference signal trace 441 corresponding to the magnitude of the difference between the reference voltage at node A and the voltage at switching node 239a of power stage 234 provided as comparator input B, in FIG. 2.

FIGS. 2 and 4 show that pre-driver 232 is configured to receive control signal 412 including control pulses 416a and 416b, and to produce drive signals P1, N1, P2, and N2. Referring back to FIG. 1, it is noted however, that control circuit 110, such as a PWM circuit, for example, will produce a series of narrow control pulses, such as control pulses 416a and 416b, in FIG. 4, even when $V_{IN}$ at input 102 is zero, or has a low value. Thus, the method described in flowchart 300 and performed by a circuit for providing real-time short-circuit detection according to the principles disclosed in the present application are typically executed when the input signal $V_{IN}$ to switched-mode system 100 is small or substantially zero.

Flowchart 300 continues with circuit 240 generating a reference voltage at node A according to drive signals P1, N1, P2, and N2, and reference resistor 247, which, as explained, above may be scaled up from an expected normal load resistance (320). As shown by FIGS. 2 and 4 and as also explained above, pre-driver 232 is configured to receive control signal 412 including control pulses 416a and 416b, and to produce drive signals P1, N1, P2, and N2. According to the present implementation, drive signals P1 and P2 are applied as control signals to the gates of p-channel field-effect transistors (PFETs) utilized as respective high side switches 246a and 246b in reference block 244, and as respective high side power switches 236a and 236b in power stage 234. In addition, in the present implementation drive signals N1 and N2 are applied as control signals to the gates of n-channel FETs (NFETs) utilized as respective low side switches 248a and 248b in reference block 244, and as respective low side power switches 238a and 238b in power stage 234. Moreover, and as may be seen from FIG. 4, a phase detection scheme is employed by pre-driver 232, in FIG. 2, such that drive signals P1 and N1 transition from HIGH to LOW on a rising edge of control pulse 416a and transition from LOW to HIGH on a falling edge of subsequent control pulse 416b. By contrast, drive signals P2 and N2 are controlled so as to transition from HIGH to LOW at a falling edge of control pulse 416a and to transition from LOW to HIGH at a rising edge of subsequent control pulse 416b.

Initially, that is prior to arrival of control pulse 416a at time t1, in FIG. 4, drive signals P1, N1, P2, and N2 are all HIGH, resulting in PFET high side switches 246a and 246b and PFET high side power switches 236a and 236b, in FIG. 2, being OFF, while NFET low side switches 248a and 248b and NFET low side power switches 238a and 238b in FIG. 2 are ON. As a result, switching nodes 249a, 249b, 239a, and 239b are each coupled to ground, there is substantially no voltage across reference resistor 247, and the reference voltage at node A is at ground as shown by trace 449a, in FIG. 4.

Focusing on the behavior of reference block 244, in FIG. 2, at time t1, in FIG. 4, the rising edge of control pulse 416a causes drive signals P1 and N1 to transition from HIGH to LOW, causing high side PFET switch 246a to turn ON and low side NFET switch 248a to turn OFF. As a result, switching node 249a and node A are coupled to $V_{dd}$ through high side switch 246a, and to ground through reference resistor 247 and low side switch 248b, which remains ON at time t1 as shown by trace 448b. Consequently, the rising edge of control pulse 416a produces a voltage substantially equal to $V_{dd}$ across reference resistor 247, causing the reference voltage at node A to substantially equal $V_{dd}$ as well. It is noted that although for the purposes of the present example, the positive power supply used for switching output stage 230 is designated as $V_{dd}$, in mobile device implementations, for example, $V_{dd}$ may correspond to the battery voltage ($V_{Bat}$) supplied by the mobile device battery power source.

At time t2, in FIG. 4, the falling edge of control pulse 416a causes drive signals P2 and N2 to transition from HIGH to LOW, causing high side PFET switch 246b to turn ON and low side NFET switch 248b to turn OFF, while high side switch 246a remains ON and low side switch 248a remains OFF. As a result, switching node 249a and node A are coupled to $V_{dd}$ through high side switch 246a, and switching node 249b is coupled to $V_{dd}$ through high side switch 246b. Consequently, the falling edge of control pulse 416a results in the reference voltage at node A remaining substantially equal to $V_{dd}$ despite there being substantially no voltage drop across reference resistor 247. Analogous transitions in reverse order are produced by the rising and falling edges of control pulse 416b. Thus, as may be understood from FIGS. 2 and 4, the reference voltage at node A remains at substantially $V_{dd}$ during the interval from time t1 to time t4, but current flows through reference resistor 247 only during the intervals between times t1 and time t2, and between times t3 and t4. Moreover, because, as mentioned above, control pulses 416a and 416b are produced by control circuit 110, in FIG. 1, when $V_{IN}$ at input 102 is substantially zero, or has a low value, the widths of control pulses 416a and 416b will be narrow, thereby limiting the duration of current flow through reference resistor 447.

Flowchart 300 continues when synchronized comparator 242 is used to compare the reference voltage at node A to a voltage produced at switching node 239a of power stage 234 (330). For example, and focusing now on the behavior of power stage 234, at time t1, in FIG. 4, transition of drive signals P1 and N1 from HIGH to LOW at time t1 causes high side PFET power switch 236a to turn ON and low side NFET power switch 238a to turn OFF. As a result, switching node 239a is coupled to $V_{dd}$ through high side power switch 236a, and to ground through load 220 and low side power switch 238b, which remains ON at time t1 as shown by trace 448b. In the absence of a short-circuit condition at load 220, the rising edge of control pulse 416a would produce a voltage substantially equal to $V_{dd}$ across load 220, causing the voltage at switching node 239a to substantially equal $V_{dd}$ as well. However, if a short-circuit condition is present at load 220, the voltage at switching node 239a will be less than $V_{dd}$, due to the presence of an effective voltage divider at switching node 239a produced by the respective source-to-drain resistances of high side power switch 236a and low side power switch 238b. Such a short-circuit load condition is represented in FIG. 4 by the suppression in the voltage rise during the interval from time t1 to time t2 shown by trace 439a and corresponding to the voltage rise at switching node 239a due to the rising edge of control pulse 416a.

At time t2, the falling edge of control pulse 416a causes drive signals P2 and N2 to transition from HIGH to LOW, causing high side PFET power switch 236b to turn ON and low side NFET power switch 238b to turn OFF, while high side power switch 236a remains ON and low side power switch 238a remains OFF. As a result, switching node 239a is coupled to $V_{dd}$ through high side power switch 236a, and switching node 239b is coupled to $V_{dd}$ through high side power switch 236b. Consequently, the falling edge of control pulse 416a causes the voltage at switching node 239a to become substantially equal to $V_{dd}$ because in the tune interval between times t2 and t3 switching nodes 239a and 239b are at substantially the same voltage. Analogous transitions in reverse order are produced by the rising and falling edges of control pulse 416b. Thus, as may be understood from FIGS. 2 and 4, switching node 239a remains at substantially $V_{dd}$ during the interval from time t2 to time t3, but a short-circuit current flows through load 220 only during the intervals between times t1 and time t2, and between times t3 and t4. It is reiterated that because control pulses 416a and 416b are produced by control circuit 110, in FIG. 1, when $V_{IN}$ at input 102 is substantially zero, or has a low value, the widths of control pulses 416a and 416b will be narrow, and the short-circuit current through load 220 will be of brief duration.

As shown in FIG. 2, synchronized comparator 242 receives the reference voltage at node A as one comparator input, and obtains the voltage at switching node 239a for use as second comparator input B. In addition, synchronized comparator 242 is clocked by adaptive clock 243. Referring again to FIG. 4, trace 441 shows the magnitude of the difference between the reference voltage at node A, provided as one input to synchronized comparator 242, and second comparator input B. As may be understood from FIGS. 2 and 4 and the discussion above, trace 441 includes difference pulses D1 and D2 triggered by the presence of a short-circuit load condition in load 220, as revealed by comparison of traces 449a and 439a. Control signal 212 and drive signals P1, N1, P2, and N2 can advantageously be used to generate adaptive clock 243, shown by derived "clock" trace 443 including clock pulses C1 and C2, for clocking synchronized comparator 242. Thus, adaptive clock 243, in FIG. 2, may be generated using the same control signals, e.g., control signal 212 and drive signals P1, N1, P2, and N2 that also produce the difference between the reference voltage at node A and the voltage produced at switching node 239a. Moreover, generation of clock pulses C1 and C2 according to control signal 212 and drive signals P1, N1, P2, and N2 ensures that the adaptive clocking of synchronized comparator 242 is timely for the purposes of comparing the reference voltage at node A to a voltage at switching node 239a symptomatic of a short-circuit load condition at load 220.

Flowchart 300 concludes with detection of a short-circuit load condition at load 220 according to output 245 of synchronized comparator 242 (340). As may be apparent from FIGS. 1 through 4 and the foregoing discussion, synchronized comparator 242 is configured to provide output 245 when the reference voltage at node A and the voltage at switching node 239a of power stage 234 are different. A benign source of such a difference may be variability in the impedance of load 220 due to its normal operation, which may not be uncommon, for example, in implementations in which load 220 corresponds to an audio speaker. However, and as discussed above, such a voltage difference may also be a dire indication of a short-circuit condition at load 220.

In order to distinguish between benign voltage discrepancies and voltage differences portending potential harm, output 245 of synchronized comparator 242 may be processed by other circuitry not shown in the present figures, but represented by the hashed lines following output 245, in FIG. 2. That additional circuitry may take the form of a digital signal processing (DSP) block, for example, as known in the art, implemented as part of switched-mode system 100, in FIG. 1, and configured to deliver a shut-down signal to control circuit 110 if a short-circuit condition is detected. Detection of a short-circuit condition at load 220 may be performed on the basis of any desirable discrimination criteria, such as the magnitude of the difference between the reference voltage at node A and the voltage at switching node 239a, a predetermined number of sequential outputs 245 produced by synchronized comparator 242 indicating a persistent voltage discrepancy, or some combination of those criteria, for example. Moreover, because detection of a short-circuit load condition according to output 245 of synchronized comparator 242 occurs when the input signal to the switched-mode system, e.g., $V_{IN}$ at input 102 in FIG. 1, is small or substantially zero, detection of the short condition can occur in real-time so as to prevent the occurrence of an over-limit current event in a power stage of switched-mode system 100.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A circuit for a switched-mode system having a pre-driver and a power stage, the circuit comprising:
   a reference circuit configured to generate a reference voltage according to drive signals from the pre-driver and a replica load; and
   a comparator circuit configured to compare the reference voltage to a switching node voltage generated by the power stage to generate and output indicative of a short-circuit in the switched-mode system,
   wherein the comparator is a synchronized comparator, and the circuit further includes an adaptive clock to drive the synchronized comparator.

2. The circuit of claim 1, wherein the adaptive clock is generated according to control signals that produce a difference between the reference voltage and the switching node voltage.

3. The circuit of claim 1, wherein the circuit is configured to enable the detection of the short-circuit prior to an occurrence of an over-limit current event in the power stage.

4. The circuit of claim 1, wherein the reference block comprises a scaled replica of the power stage.

5. The circuit of claim 1, wherein the switched-mode system is one of a class-D audio amplifier and a switching regulator.

6. A switched-mode system comprising:
   a power stage circuit including a switching node voltage;
   a pre-driver circuit configured to produce drive signals; and
   a circuit including:
      a reference block circuit coupled between the pre-driver and the power stage and configured to generate a reference voltage according to the drive signals and a replica load;
      a synchronized comparator circuit configured to compare the reference voltage to the switching node voltage of the power stage to produce an output indicative of a short-circuit load condition of the switched-mode system; and
      an adaptive clock to drive the synchronized comparator.

7. The switched-mode system of claim 6, wherein the adaptive clock is generated according to control signals that produce a difference between the reference voltage and the switching node voltage.

8. The switched-mode system of claim 6, wherein the circuit is configured to enable the detection of the short-circuit load condition prior to an occurrence of an over-limit current event in the power stage.

9. The switched-mode system of claim 6, wherein the reference block comprises a scaled replica of the power stage.

10. The switched-mode system of claim 6, wherein the switched-mode system is a class-D audio amplifier.

11. The switched-mode system of claim 6, wherein the switched-mode system is a switching regulator.

12. A method for use by a circuit in a switched-mode system, the method comprising:
   receiving drive signals from a pre-driver circuit;
   obtaining a switching node voltage generated by a power stage circuit;
   generating, by a reference circuit, a reference voltage using the drive signals and a replica load;
   comparing the reference voltage to the switching node voltage using a comparator circuit;
   outputting, by the comparator, a signal indicative of a short-circuit in the switched-mode system; and
   clocking the comparator using an adaptive clock.

13. The method of claim 12, further comprising generating the adaptive clock according to control signals that produce a difference between the reference voltage and the switching node voltage.

14. The method of claim 12, wherein the detecting occurs prior to an occurrence of an over-current event.

15. The method of claim 12, wherein the switched-mode system is a class-D audio amplifier.

16. The method of claim 12, wherein the switched-mode system is a switching regulator.

* * * * *